(12) United States Patent
Lu (10) Patent No.: US 9,964,575 B2
(45) Date of Patent: May 8, 2018

(54) CAPACITIVE IMAGING DEVICE WITH ACTIVE PIXELS

(71) Applicant: Palo Alto Research Center Incorporated, Palo Alto, CA (US)

(72) Inventor: JengPing Lu, Fremont, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days. days.

(21) Appl. No.: 14/139,129

(22) Filed: Dec. 23, 2013

(65) Prior Publication Data
US 2014/0159746 A1 Jun. 12, 2014

Related U.S. Application Data

(63) Continuation of application No. 13/667,112, filed on Nov. 2, 2012, now Pat. No. 8,618,865.

(51) Int. Cl.
*G01R 27/26* (2006.01)
*G06F 3/044* (2006.01)
*G06K 9/00* (2006.01)

(52) U.S. Cl.
CPC ......... *G01R 27/2605* (2013.01); *G06F 3/044* (2013.01); *G06K 9/0002* (2013.01)

(58) Field of Classification Search
CPC .. G06K 9/0002; G06F 3/044; G01R 27/2605; G01R 27/26; H01L 31/02
See application file for complete search history.

(56) References Cited

U.S. PATENT DOCUMENTS

| | | | |
|---|---|---|---|
| 4,112,365 A | * | 9/1978 | Larson .................. G01D 5/202 324/173 |
| 4,254,345 A | | 3/1981 | Ullrich |
| 4,323,846 A | | 4/1982 | Haraszti |
| 4,359,756 A | | 11/1982 | Schneider et al. |

(Continued)

FOREIGN PATENT DOCUMENTS

| | | |
|---|---|---|
| CN | 102017147 | 4/2011 |
| GB | 2475055 | 5/2011 |
| JP | 2010517250 | 5/2010 |

OTHER PUBLICATIONS

Hong, "On-chip Spatial Image Processing with CMOS Active Pixel Sensors", 2001, 234 pages.

(Continued)

*Primary Examiner* — Jermele M Hollington
*Assistant Examiner* — Alvaro Fortich
(74) *Attorney, Agent, or Firm* — Hollingsworth Davis, LLC (57) ABSTRACT

An apparatus includes a sensor array with a plurality of active pixels. Each active pixel in the sensor array includes: a three transistor (3T) sensor with a source follower transistor, and a detection diode coupled in series to a parasitic capacitor at a sensing junction. A gate of the source follower transistor amplifier is coupled to the sensing junction. The apparatus includes an insulator layer over the sensor array. The insulator layer provides a variable capacitance to the sensing junctions of underlying active pixels in response to portions of an object being proximate to the insulator layer. The variable capacitance is used to detect an image of the object.

9 Claims, 8 Drawing Sheets

(56) References Cited

U.S. PATENT DOCUMENTS

| | | | |
|---|---|---|---|
| 5,083,016 A * | 1/1992 | Wyles | H04N 3/1512 250/208.1 |
| 5,325,442 A | 6/1994 | Knapp | |
| 5,940,526 A | 8/1999 | Setlak et al. | |
| 6,191,593 B1 | 2/2001 | Tartagni et al. | |
| 6,201,270 B1 * | 3/2001 | Chen | H01L 27/14609 250/214.1 |
| 6,246,043 B1 | 6/2001 | Merrill | |
| 6,410,899 B1 * | 6/2002 | Merrill | H04N 3/155 250/208.1 |
| 6,437,341 B1 | 8/2002 | Izumi et al. | |
| 6,681,033 B1 * | 1/2004 | Yano et al. | 382/124 |
| 6,974,971 B2 * | 12/2005 | Young | 257/72 |
| 7,006,078 B2 * | 2/2006 | Kim | 345/173 |
| 7,280,167 B2 | 10/2007 | Choi et al. | |
| 7,616,786 B2 | 11/2009 | Setlak | |
| 7,739,912 B2 | 6/2010 | Schneider et al. | |
| 7,755,369 B2 | 7/2010 | Chuang et al. | |
| 8,201,739 B2 | 6/2012 | Schneider et al. | |
| 8,384,180 B2 | 2/2013 | Lu et al. | |
| 8,441,459 B2 | 5/2013 | Chen et al. | |
| 8,447,077 B2 | 5/2013 | Benkley | |
| 8,519,320 B2 | 8/2013 | Miyazawa et al. | |
| 8,539,837 B2 | 9/2013 | Wong | |
| 8,601,876 B2 | 12/2013 | Schneider et al. | |
| 8,618,865 B1 | 12/2013 | Lu | |
| 8,888,004 B2 | 11/2014 | Setlak | |
| 8,970,537 B1 | 3/2015 | Shepelev | |
| 9,035,906 B2 | 5/2015 | Elia | |
| 9,081,453 B2 | 7/2015 | Solven | |
| 9,081,457 B2 | 7/2015 | Bulea | |
| 9,160,331 B2 | 10/2015 | Bakken | |
| 9,176,597 B2 | 11/2015 | Soo | |
| 9,214,911 B2 | 12/2015 | Kropfitsch | |
| 2003/0151572 A1 | 8/2003 | Kumada | |
| 2004/0000632 A1 | 1/2004 | Apte | |
| 2004/0155973 A1 * | 8/2004 | Bea | H04N 5/3575 348/308 |
| 2004/0251917 A1 | 12/2004 | Blanchard | |
| 2005/0079386 A1 | 4/2005 | Brown, Jr. | |
| 2005/0094855 A1 | 5/2005 | Proano et al. | |
| 2006/0101281 A1 * | 5/2006 | Zhang | H01P 5/107 713/186 |
| 2007/0024546 A1 * | 2/2007 | Jang | G06K 9/0002 345/78 |
| 2007/0052829 A1 * | 3/2007 | Brissot | H01L 27/14603 348/308 |
| 2007/0187724 A1 * | 8/2007 | Kaufmann | H01L 27/14603 257/239 |
| 2007/0216657 A1 | 9/2007 | Konicek | |
| 2008/0055447 A1 | 3/2008 | Bellingrath | |
| 2008/0062140 A1 * | 3/2008 | Hotelling | G09G 3/3648 345/173 |
| 2008/0246539 A1 | 10/2008 | Zadeh | |
| 2008/0283885 A1 * | 11/2008 | Hynecek | H01L 27/14603 257/292 |
| 2008/0283886 A1 * | 11/2008 | Hynecek | H01L 27/14603 257/292 |
| 2008/0297878 A1 | 12/2008 | Brown | |
| 2009/0027352 A1 * | 1/2009 | Abele | G06K 9/0002 345/173 |
| 2009/0166627 A1 * | 7/2009 | Han | H01L 27/14634 257/53 |
| 2009/0212197 A1 * | 8/2009 | Buttgen | H01L 27/14603 250/208.1 |
| 2009/0224343 A1 * | 9/2009 | Akram | H01L 27/1464 257/432 |
| 2009/0224351 A1 * | 9/2009 | Hsieh | H01L 27/14609 257/444 |
| 2009/0321613 A1 * | 12/2009 | Veeder | H03F 3/45183 250/208.1 |
| 2010/0079178 A1 * | 4/2010 | Mheen | H04N 5/357 327/109 |
| 2010/0079406 A1 | 4/2010 | Chen et al. | |
| 2010/0194697 A1 | 8/2010 | Hotelling | |
| 2010/0292945 A1 | 11/2010 | Reynolds | |
| 2011/0001860 A1 | 1/2011 | Taruki | |
| 2011/0025635 A1 | 2/2011 | Lee | |
| 2011/0204461 A1 | 8/2011 | Lee | |
| 2012/0075168 A1 | 3/2012 | Osterhout et al. | |
| 2012/0112047 A1 * | 5/2012 | Brown | G06F 3/0412 250/214.1 |
| 2012/0144920 A1 | 6/2012 | Wong et al. | |
| 2012/0147698 A1 | 6/2012 | Wong | |
| 2012/0206408 A1 | 8/2012 | Brown | |
| 2012/0256077 A1 | 10/2012 | Yen et al. | |
| 2013/0135277 A1 | 5/2013 | Ikeda | |
| 2013/0200907 A1 * | 8/2013 | Schneider et al. | 324/686 |
| 2014/0159746 A1 | 6/2014 | Lu | |
| 2014/0266262 A1 | 9/2014 | Takhibakhsh | |
| 2015/0030217 A1 | 1/2015 | Wickboldt | |

OTHER PUBLICATIONS

U.S. Appl. No. 13/628,686, filed Sep. 27, 2012.
File History for U.S. Appl. No. 14/257,571, 51 pages.
File History for U.S. Appl. No. 14/257,566, 63 pages.
File History for EP App. No. 13191016.8 as retrieved from the EP Electronic File System dated Aug. 5, 2016, 90 pages.
Kanda et al., "Integrated Active Matrix Capacitive Sensors for Touch Panel LTPS-TFT LCDs", International Symposium, Society for Information Display, May 18, 2008, 4 pages.
File History for U.S. Appl. No. 14/257,566, 129 pages.
File History for U.S. Appl. No. 14/257,566, 142 pages.
File History for U.S. Appl. No. 14/257,566, 358 pages.

* cited by examiner

CAPACITIVE IMAGING DEVICE WITH ACTIVE PIXELS

This application is a continuation of U.S. patent application Ser. No. 13/667,112, filed on Nov. 2, 2012 which is incorporated herein by reference in its entirety.

SUMMARY

Examples described herein are directed to a capacitive imaging device with active pixels. In one embodiment, an apparatus includes a sensor array with a plurality of active pixels. Each active pixel in the sensor array includes a three transistor (3T) sensor with a source follower transistor, and a detection diode coupled in series to a parasitic capacitor at a sensing junction. A gate of the source follower transistor amplifier is coupled to the sensing junction. The apparatus includes an insulator layer over the sensor array. The insulator layer provides a variable capacitance to the sensing junctions of underlying active pixels in response to portions of an object being proximate to the insulator layer. The variable capacitance is used to detect an image of the object.

In another embodiment, a method involves applying a first voltage level to a data line of a three-transistor (3T) sensor of an active pixel in a sensor array. The 3T sensor includes a source follower transistor coupled to the data line. The source follower transistor has a gate coupled to a sensing junction detection diode that is coupled in series to a parasitic capacitor at the sensing junction. A second voltage level is applied to the data line, and a current flowing at the data line is determined in response to the second voltage level being applied. A variable capacitance of an insulator layer over the active pixel is determined based on the current. A proximity pattern at the insulator layer is determined based on the variable capacitance.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure relates to touch/proximity pattern sensors such as fingerprint sensors. Generally, finger prints (and similar patterns, e.g., on hands and feet) are readily accessible biometric indicators that are unique to each person. As a result, computer scanned hand/finger print images can be used for purposes such as authentication. For example, a scanning sensor may include a flat surface against which to place the finger (or any scanned object). In response to the contact, the sensor generates an image of the texture/contours of the scanned object. Pattern recognition software can compare metrics of the scanned image to stored metrics, and confirm identity based on a match of the metrics.

There are a number of ways a fingerprint image can be obtained, such as using optical sensors. Embodiments described below use capacitive sensing. Generally, an object that touches a sensing surface will affect the local electric capacitance of the surface wherever there is contact. While capacitive touch input sensing is widely used to determine coarse indications of contact location (e.g., touchscreens, touchpads), the sensors described herein may be capable of much higher resolution (e.g., on the order of 500 dpi) than a conventional touch input sensor. It will be understood that, while the embodiments herein may be described in the context of biometric touch sensing, the embodiments and variations thereof may be applicable to other devices. For example, devices such as non-destructive testing imagers may obtain an image based on portions of an object that touch and/or are in relatively close proximity to a contact sensing element.

Figure 1:
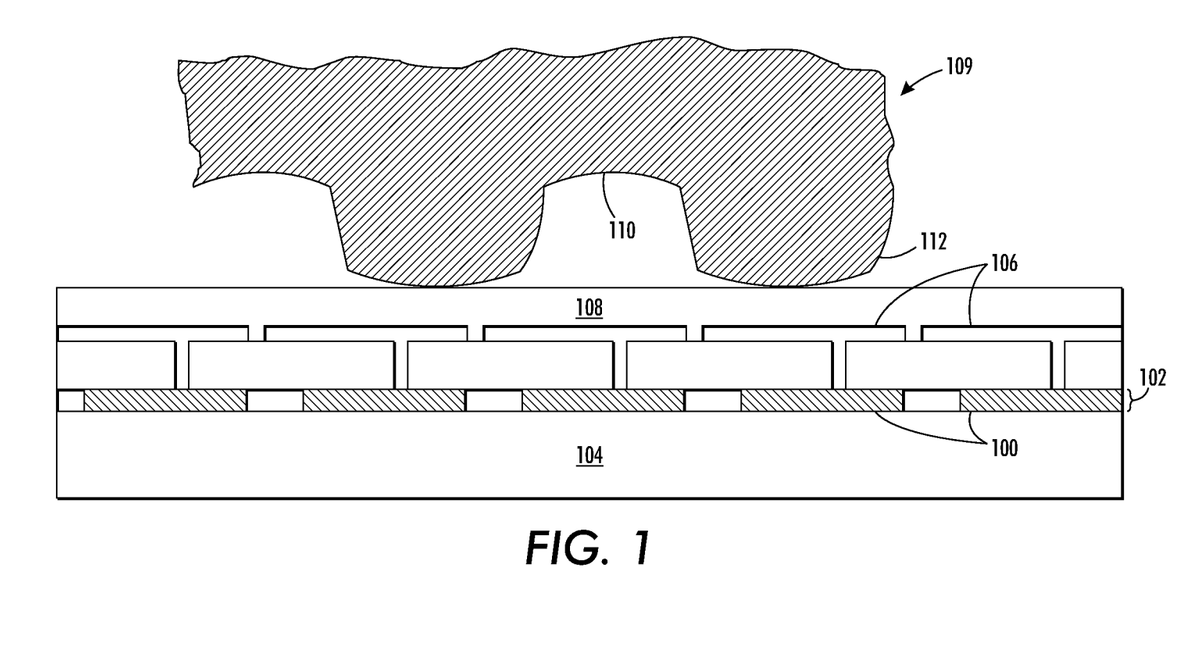
FIG. 1 is a cross sectional view of a capacitive touch pattern sensor according to an example embodiment.

In reference now to FIG. 1, a cross sectional view illustrates a capacitive touch pattern sensor according to an example embodiment. A sensor array 102 is built on top of a substrate 104 (e.g., glass). The sensor array 102 includes a plurality of active pixels 100, examples of which will be described further below. Generally, each pixel 100 is electrically coupled to a sensing pad 106. The pads 106 are electrically conductive and covered by an insulator layer 108. The insulator layer 108 may be made from a protective coating polymer such as Parylene.

A conductive object 109 contacting the insulating layer 108 changes a local capacitance at the pads 106, and this is detected by active pixels 100 that are coupled to the affected pads 106. For example, a fingerprint ridge 112 will cause a capacitance to be measured at a pad 106 directly below the ridge 112 that is different than another pad 106 directly below fingerprint valley 110. The capacitance may vary not only based on contact versus non-contact, but may also vary depending on the relative proximity of non-contacting portions. For example, different fingerprint valleys may cause different capacitance due to different distances from a surface of the insulating layer 108.

Figure 2:
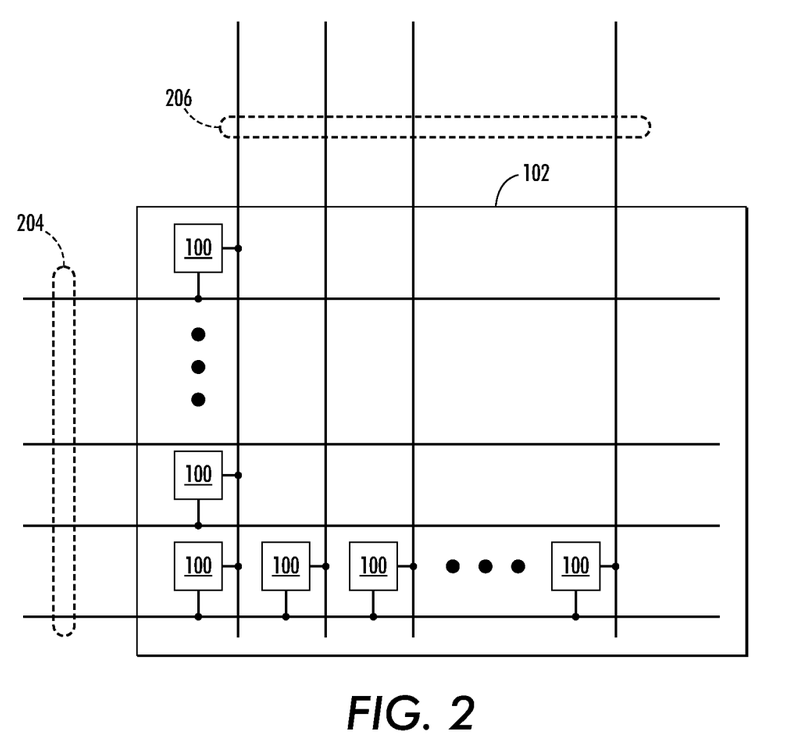
FIG. 2 is a block diagram illustrating details of a sensor array according to an example embodiment.

In reference now to FIG. 2, a block diagram illustrates details of a sensor array 102 according to an example embodiment. The sensor array 102 includes a number of individual active pixel elements 100. Each of these elements 100 are associated with one of a row line 204 and a column line 206. Generally, to detect an image, each of the row lines 204 may be activated in sequence. Activating a row line 204 causes all elements 100 in the rows to become active (e.g., switching on an enabling transistor). Then each of the column lines (e.g., data lines) 206 is scanned to read the individual elements 100 in the currently activated row. Alternate methods of scanning the elements 100 are known in the art, and the embodiments need not be limited to what is shown in FIG. 2.

As will be described in greater detail below, the reading of each column line 206 may involve applying to each column line 206 a first voltage level for a first period of time, and then switching to a second, lower voltage level for a second period of time. The first voltage level charges the currently read element 100, and the second voltage level causes a current flow via the column line that indicates a sensed capacitance of the element 100.

Figure 3:
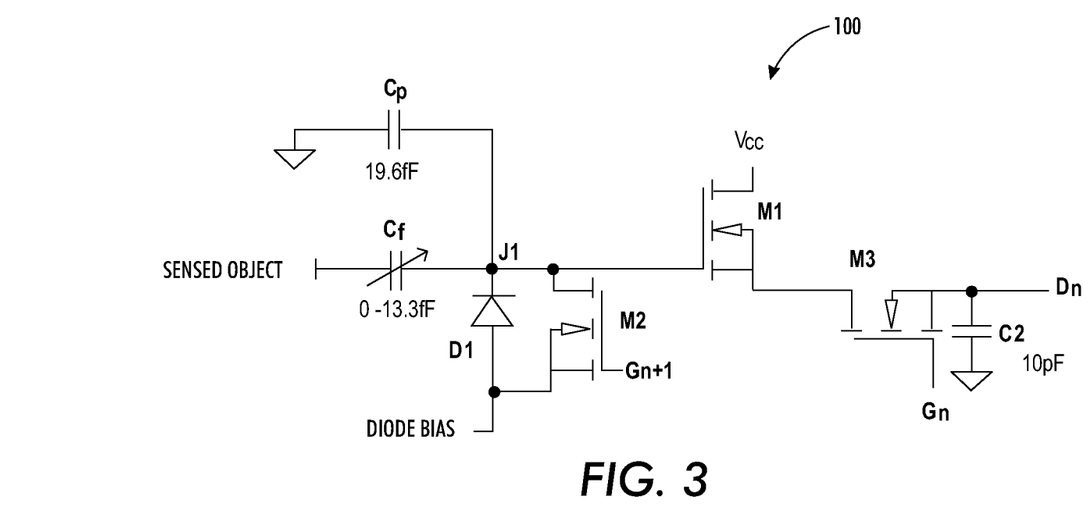
FIG. 3 is a schematic diagram illustrating an active pixel circuit according to an example embodiment.

In reference now to FIG. 3, a schematic diagram illustrates an active pixel 100 according to an example embodiment. The active pixel 100 is generally configured as a three transistor sensor, sometimes abbreviated as a 3T sensor pixel. The three transistors M1, M2, M3 in this diagram are n-type, low-temperature, polycrystalline silicon (Poly-Si) thin-film transistors (TFTs) although it is possible to use other types of transistor devices such as metal oxide semiconductor, field-effect transistors (MOSFETs). Transistor M2 is configured as a reset transistor in response to reset signal $G_{n+1}$, which is also an enabling line for a neighboring pixel. When $G_{n+1}$ is activated, M2 shorts out high frequency rectifying/detection diode D1, allowing sensing junction J1 to be tied to the biasing voltage of D1. By tying the reset transistor M2 to the enable line of the following row ($G_{n+1}$), the active pixels 100 can be reset without using a separate set of reset lines. In other configurations, M2 may be reset by another line, such as the preceding row enable line ($G_{n-1}$), a separate reset line, a data line $D_n$ of an adjacent column, etc.

A seen in FIG. 3, two capacitors, $C_p$ and $C_f$ are coupled to the detection diode D1 at sensing junction J1. The $C_p$ component is a parasitic capacitor, having one end coupled to the sensing junction J1 and the other end at ground. The $C_f$ component models the sensed capacitance of the pads and insulating layer (see sensing pads 106 and insulating layer 108 in FIG. 1). The effective value of $C_f$ may vary from zero (or near zero) to some maximum value (in this example on the order of 10 fF) depending on whether or not an object (e.g., fingerprint ridge) is contacting the insulating layer. As will be described in greater detail below, the sensed capacitance can be found based on a ratio of gate capacitance of M1 ($C_{M1}$) and the sum of $C_f$, $C_p$, and $C_{M1}$.

The M1 transistor is configured as a source follower having its gate tied to the sensing junction J1. The output of M1 is tied to data line $D_n$ when enabling transistor M3 is switched on in response to enable signal $G_n$. The transistor M1 also acts as a charge pump to charge up capacitors $C_f$ and $C_p$. This charging occurs during the operation cycle of the pixel 100, when M3 is enabled. In one embodiment, the operation cycle is between 50-70 μs. During part of the cycle (charging interval), the potential of data line $D_n$ is brought down to a first voltage level, which causes excess charge built up on gate capacitance $C_{M1}$ by current flowing through diode D1 to maintain a stable charge voltage $V_{charge}=V_{diode}$ bias.

When the data line voltage is returned to its original voltage in a later part of the operation cycle (sensing interval) the charge accumulated on the gate of M1 during charging interval will be redistributed among Cp, Cf, and $C_{M1}$. The final voltage ($V_{sense}$) at the sensing junction J1 at the end of sensing interval becomes input of source follower M1, and the output of M1 at this interval can be read out on Dn. The difference $\Delta V$ between the $V_{charge}$ and $V_{sense}$ potentials can be expressed as $\Delta V \approx C_{M1}/(C_f+C_p+C_{M1})$. Generally, the capacitance $C_f$ may be determined by measuring current flowing through $D_n$ during the sensing interval.

Although specific component types and respective values are shown in FIG. 3, one of ordinary skill in the art will appreciate that component types and variables can vary from what is shown while still falling within the scope of the claimed invention. For example, the capacitance value of $C_{M1}$ and $C_p$ can be modified from what is shown to match a physical configuration that provides sensed capacitance $C_f$.

In one configuration, $C_f$ has been found to be on the order of 10 fF (between 1 fF and 100 fF) and so $C_{M1}$ and $C_p$ are selected to fall within a similar range. It should be noted that the value of $C_{M1}$ may be inherent in the TFT design, and so modification of $C_{M1}$ may be achieved by modifying physical configuration/physical dimension and/or type of transistor used, or by the addition of electrical components (e.g., inline capacitor). In another variation, p-channel transistors may be used in the circuit, e.g., by replacing the illustrated n-channel transistors with p-channel devices, and by reversing diode direction and voltage polarities.

Figure 4:
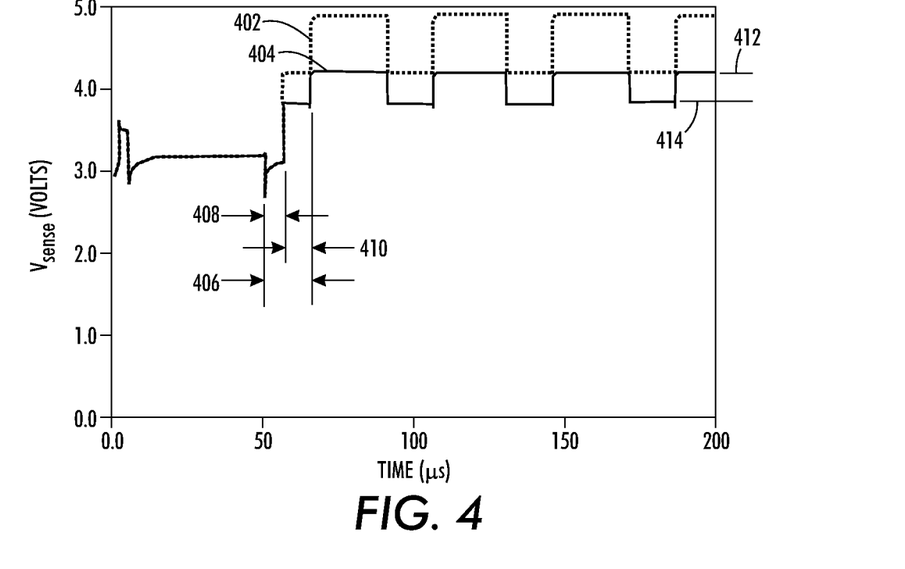
FIGS. 4 and 5 are graphs illustrating results of a SPICE simulation of a pixel configured as shown in FIG. 3.
Figure 5:
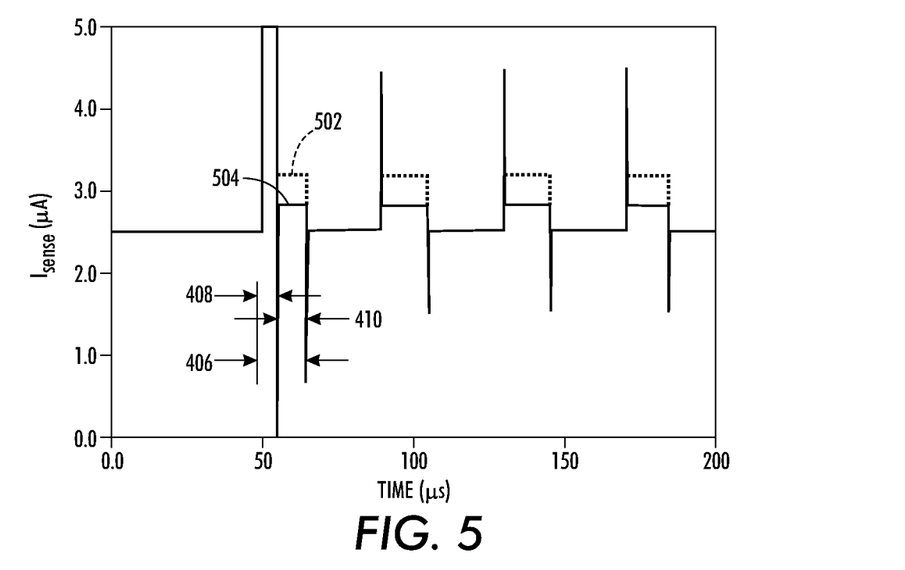

In reference now to FIGS. 4 and 5, graphs illustrates results of a SPICE simulation of a pixel 100 configured as shown in FIG. 3. In FIG. 4, traces 402 and 404 show the gate potential of M1 for $C_f=0$ and $C_f=13$ fF, respectively. Time period 406 represents an operation cycle of M1. Intervals 408 and 410 represent respective charging and readout intervals within the operational cycle 406. Voltages 412 and 414 are proportional to the different values of $C_f$, and can be used as basis for a detection signal, e.g., data line current out of the pixel 100. In FIG. 5, traces 502, 504 represent current out of the pixel 100 for $C_f=0$ and $C_f=13$ fF, respectively. The respective intervals 408, 410 are also shown in FIG. 5, and the difference between currents during sensing interval 410 can be used to determine sensed capacitance.

The potential difference applied to the data line between charging and readout intervals 408 and 410 can be provided by what is known as a data line reset switch. The data line reset switch includes TFTs located at the end of each data line, on the same substrate of pixel array. The TFTs are activated by a control line shared by all data line reset TFTs. When the data line reset switches are activated, they connect the data lines to an external voltage source and set the data line potential to the value defined by the voltage source. There are alternate ways to affect this potential difference. For example, $V_{ref}$ of readout charge amplifiers (coupled to readout lines 206 in FIG. 2) can be varied while a pixel is currently activated.

Figure 6:
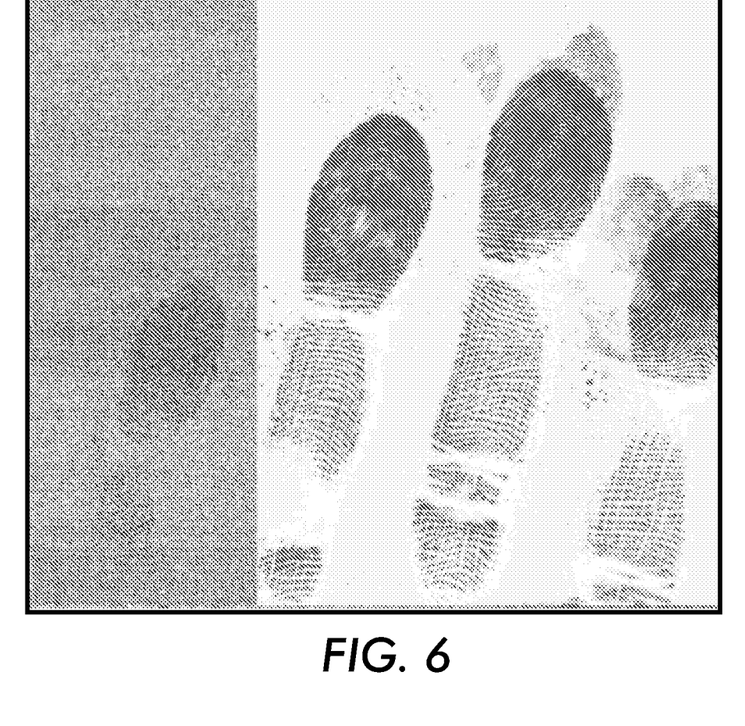
FIG. 6 is a sample fingerprint image obtained from a capacitive touch pattern sensor according to an example embodiment.

By scanning each pixel in an active array as described above, a difference between a charge and sensing voltage causes a current to flow on the data line of each pixel. Measurements of these currents can be assembled into an image, such as the sample handprint image shown in FIG. 6. Because thin-film transistor (TFT) manufacturing technology is mature, it is possible to economically manufacture large-format (e.g., four fingers at once) finger print sensors using this type of active circuitry. This type of sensor is also capable of producing high quality scans. The scan quality is due at least in part to the high signal-to-noise ratio (SNR) obtainable using active capacitive sensor pixels.

Figure 7:
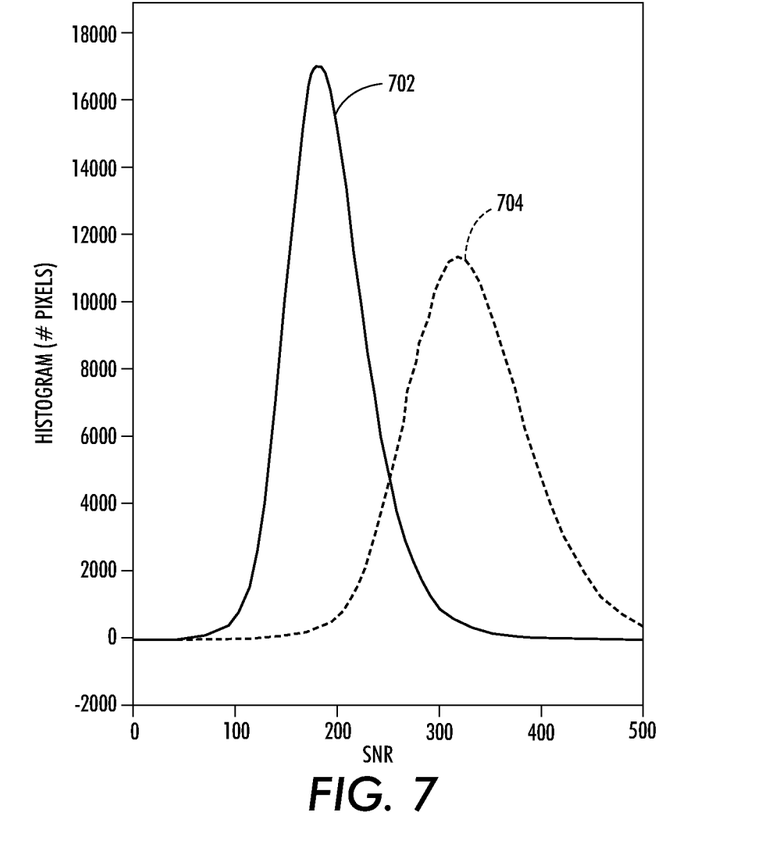
FIG. 7 is a histogram of measured signal-to-noise active pixels of a capacitive sensing device according to an example embodiment.

In reference now to FIG. 7, a histogram shows measured SNR for an active pixel capacitive sensing device according to an example embodiment. Curve 702 represents bright field SNR for a pixel array and curve 704 represents dark field SNR measurements for the same array. The peak of curve 702 is at 183, and the peak of curve 704 is 310. These average/median values are well above acceptable minimal SNR standards (e.g., SNR>125) for this type of device.

One reason the active pixel sensor described herein can achieve these SNR levels is due to the small capacitance values of $C_{M1}$, $C_f$, and $C_p$ as described above in reference to FIG. 3. The gate capacitance $C_{M1}$ is on the order of 10 fF (e.g., between 1 fF and 100 fF), which is comparable (e.g., same order of magnitude) to the plate capacitance across the insulator, modeled in FIG. 3 as $C_f$, and the value of the parasitic capacitor $C_p$. These low capacitances make the circuit very sensitive to changes in $C_f$. The low sensing capacitance, combined with the signal amplification provided by M2, provides superior sensitivity as reflected in the SNR measurements shown above.

Figure 8:
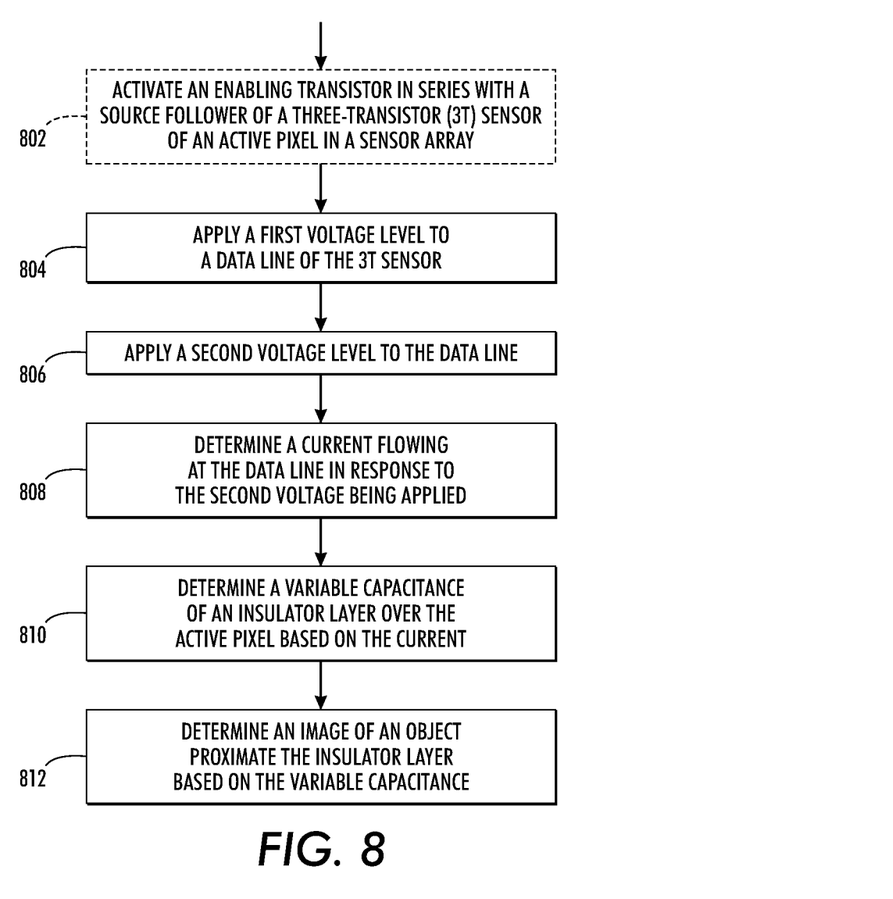
FIGS. 8 and 9 are flowcharts illustrating procedures according to example embodiments.

In reference now to FIG. 8, a flowchart illustrates a method according to an example embodiment. The method involves activating 802 an enabling transistor in series with a source follower of a 3T sensor of an active pixel in a sensor array. A first voltage level is applied 804 to a data line of the 3T sensor. A second voltage is then applied 806 to the data line. A current flowing at the data line in response to the second voltage being applied is determined 808. A variable capacitance of an insulator layer over the active pixel may be determined 810 based on the current, and an image of an object proximate the insulator layer may be determined 812 based on the variable capacitance.

Figure 9:
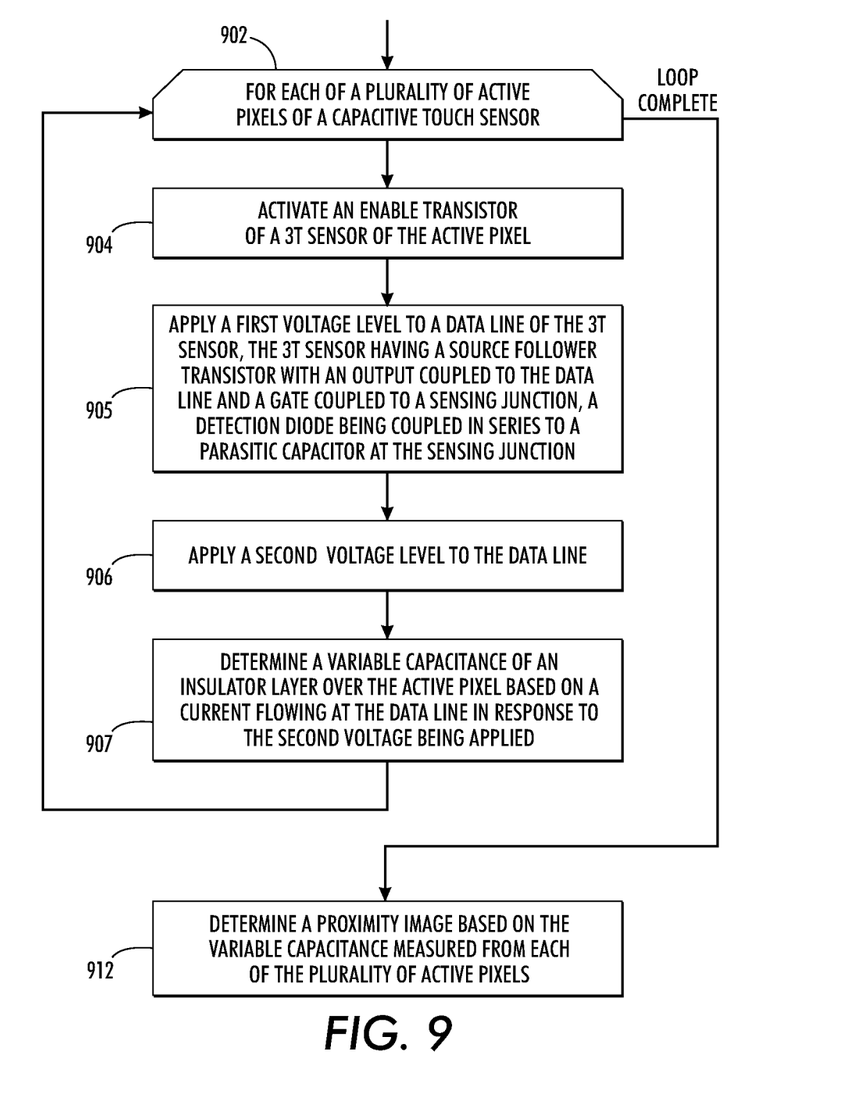

In reference now to FIG. 9, a flowchart illustrates a method according to an example embodiment. The method involves repeatedly performing operations 904-907, as indicated by loop entry block 902. The loop is performed for each of a plurality of active pixels of a capacitive touch sensor, e.g., via scanning some or all row and column lines of an array as shown in FIG. 2.

For each active pixel, an enable transistor of a 3T sensor of the active pixel is enabled 904, and may remain enabled at least during subsequent steps 905-907. A first voltage level is applied 905 to a data line of the active pixel. The 3T sensor has a source follower transistor coupled to the data line (e.g., via the enable transistor) with a gate coupled to a sensing junction. A detection diode is coupled in series to a parasitic capacitor at the sensing junction.

A second voltage is applied 906 to the data line. A variable capacitance of an insulator layer over the active pixel is determined 907 based on a current flowing at the data line in response to the second voltage being applied. When the loop 902 is complete, a proximity image is determined 912 based on the variable capacitance measured from each of the plurality of active pixels.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A capacitive image sensor comprising:
a sensor array comprising a plurality of active pixels, each active pixel in the sensor array comprising:
    a three-transistor (3T) sensor comprising a source follower transistor having a gate, wherein the 3T sensor has a charge cycle and a readout cycle, wherein during the charge cycle capacitance builds at the gate of the source follower transistor to establish a first gate voltage; and
    an insulator layer over the sensor array, wherein during the reading cycle the insulator layer provides a variable capacitance at the gate of each of the source follower transistors, the variable capacitance establishing a second gate voltage, wherein the difference between the first and second gate voltage is correlative to an object being proximate to the insulator layer, the difference within each active pixel used to detect an image of the object.

2. The capacitive image sensor of claim 1, further comprising an enabling transistor to enable the source follower transistor and a reset transistor to reset the source follower transistor.

3. The capacitive image sensor of claim 2, wherein the enabling transistor enables the charge cycle.

4. The capacitive image sensor of claim 1, further comprising a biasing diode electrically coupled to the gate of the source follower transistor in each active pixel.

5. The capacitive image sensor of claim 1, wherein the object is capable of altering the variable capacitance when it is near the sensor array.

6. The capacitive image sensor of claim 1, wherein the sensor array provides a resolution of at least 500 dpi.

7. The capacitive image sensor of claim 1, wherein the insulator layer comprises a polymer layer, the sensor further comprising a plurality of electrically conductive pads coupling the insulator layer and the gates of the source follower transistor of the underlying pixels.

8. A method for detecting the nearness of an object comprising:
    initiating a charge cycle within a plurality of active three-transistor capacitive imaging pixels of a sensor array comprising a plurality of pixels, each active pixel in the sensor array having a source follower transistor having a gate, an enabling transistor to enable the source follower transistor and a reset transistor to reset the source follower transistor;
    reading a first voltage at the gate of each of the source follower transistors;
    initiating a readout cycle within each of the plurality of active pixels, wherein an insulator layer over the sensor array provides a variable capacitance at the gate of each of the source follower transistors;
    reading a second voltage at the gate of each of the source follower transistors, wherein the second voltage is established by the variable capacitance;
    determining the difference between the first voltage and the second voltage for each of the plurality of active pixels, the difference correlative to the nearness of the object; and
    detecting an image of the object using the difference within each active pixel.

9. The method of claim 8, wherein the array provides a resolution of at least 500 dpi.

* * * * *